United States Patent
Sumoto

(10) Patent No.: US 10,279,616 B2
(45) Date of Patent: May 7, 2019

(54) PRINTING PLATE

(71) Applicant: KOMURA-TECH CO., LTD., Higashi-Osaka-shi, Osaka (JP)

(72) Inventor: Youichi Sumoto, Higashi-Osaka (JP)

(73) Assignee: KOMURA-TECH CO., LTD., Higashi-Osaka-shi (JP)

( * ) Notice: Subject to any disclaimer, the term of this patent is extended or adjusted under 35 U.S.C. 154(b) by 0 days.

(21) Appl. No.: 16/080,794

(22) PCT Filed: Mar. 6, 2017

(86) PCT No.: PCT/JP2017/008646
§ 371 (c)(1),
(2) Date: Aug. 29, 2018

(87) PCT Pub. No.: WO2017/159415
PCT Pub. Date: Sep. 21, 2017

(65) Prior Publication Data
US 2019/0061405 A1    Feb. 28, 2019

(30) Foreign Application Priority Data

Mar. 16, 2016 (JP) ................................. 2016-052454

(51) Int. Cl.
| | | |
|---|---|---|
| *B41N 1/12* | (2006.01) | |
| *B41N 1/22* | (2006.01) | |
| *B41M 1/04* | (2006.01) | |

(52) U.S. Cl.
CPC ................. *B41N 1/12* (2013.01); *B41M 1/04* (2013.01); *B41N 1/22* (2013.01)

(58) Field of Classification Search
None
See application file for complete search history.

(56) References Cited

U.S. PATENT DOCUMENTS

2001/0029859 A1    10/2001   Samworth
2016/0221379 A1    8/2016    Namba et al.

FOREIGN PATENT DOCUMENTS

JP   S63-188046 A    8/1988
JP   H07-270795 A    10/1995
(Continued)

OTHER PUBLICATIONS

International Search Report dated Apr. 18, 2017, issued in counterpart International Application No. PCT/JP2017/008646 (2 pages).
(Continued)

*Primary Examiner* — Joshua D Zimmerman
(74) *Attorney, Agent, or Firm* — Westerman, Hattori, Daniels & Adrian, LLP

(57) ABSTRACT

The present disclosure provides a printing plate capable of stably suppressing occurrence of a marginal phenomenon. The printing plate includes a printing projection portion having a plurality of projections formed in a distributed manner on a top surface of the printing projection portion, wherein the top surface of the printing projection portion includes a center region and a peripheral edge region adjacent to a peripheral edge of the center region, wherein the peripheral edge region includes printing direction portions extending along a printing direction and perpendicular direction portions extending along a perpendicular direction perpendicular to the printing direction, wherein distribution densities of the projections are different among the center region, the printing direction portions, and the perpendicular direction portions, and wherein, among the distribution densities, a distribution density in the perpendicular direction portions is highest, and a distribution density in the printing direction portions is lowest.

5 Claims, 4 Drawing Sheets

(56) References Cited

FOREIGN PATENT DOCUMENTS

| JP | 11-221976 A | 8/1999 |
| JP | 2002-293049 A | 10/2002 |
| JP | 2003-53927 A | 2/2003 |
| JP | 3376908 B2 | 2/2003 |
| WO | 2015/056703 A1 | 4/2015 |

OTHER PUBLICATIONS

International Preliminary Report on Patentability (Form PCT/IB/338) issued in counterpart International Application No. PCT/JP2017/008646 dated Sep. 27, 2018, with Form PCT/IB/373 and PCT/ISA/237 (6 pages).

(b)

(c)

(a) Example (b) Related-art Example (c) Comparative Example 1

(d) Comparative Example 2

(e) Comparative Example 3

(f) Comparative Example 4

--o-- : Center region

--■-- : Peripheral edge region (b)

(c)

PRINTING PLATE

TECHNICAL FIELD

The present disclosure relates to a printing plate to be used for printing such as flexo printing.

BACKGROUND ART

Typically, flexo printing is performed using a printing machine like the one as illustrated in FIG. 3. This printing machine includes a plate cylinder 51, an anilox roll 52, an ink supply device 53, a scraper 54, and a print stage 55. The plate cylinder 51 has a columnar shape, and a printing plate P1 is mounted to the plate cylinder 51. The anilox roll 52 is configured to cause ink to adhere to the printing plate P1. The ink supply device 53 is configured to supply the ink to a surface of the anilox roll 52. The scraper 54 is configured to scrape off surplus ink from the surface of the anilox roll 52. The print stage 55 is configured to receive a printing material Q subjected to printing.

The flexo printing using the printing machine is performed in the following manner. Specifically, the printing plate P1 is mounted to a peripheral surface of the plate cylinder 51. While the plate cylinder 51 is rotated, ink supplied from the ink supply device 53 is caused to adhere to a print region of the printing plate P1 through the anilox roll 52. The adhering ink is transferred to the printing material Q such as a glass board placed on the print stage 55, thereby performing printing. At this time, the print stage 55 is caused to slide in synchronization with the rotation of the plate cylinder 51.

Typically, as illustrated in a plan view of FIG. 4A and in a sectional view of FIG. 4B taken along the line T-T of FIG. 4A, the printing plate P1 includes a base portion 11 having a flat plate shape and a printing projection portion 12 formed at a center portion of a surface of the base portion 11. The printing projection portion 12 is the print region, and a portion of the base portion 11 surrounding the printing projection portion 12 is not involved in printing. Further, as illustrated in FIG. 4C being an enlarged sectional view of main portions of FIG. 4A, a plurality of projections 13 with gaps 14 are formed in a distributed manner on a top surface of the printing projection portion 12, and the ink is retained in the gaps 14. The printing plate P1 is flexible so that the printing plate P1 can be mounted to the peripheral surface of the plate cylinder 51 (see FIG. 3).

However, in the flexo printing, the printing projection portion 12 of the printing plate P1 is brought into contact with the anilox roll 52 and the printing material Q. Thus, the pressure generated at the time of contact causes the ink retained on the printing projection portion 12 to move to a peripheral edge region 12D of the printing projection portion 12. Therefore, such action causes occurrence of a so-called "marginal phenomenon" in which a thickness of the printing film formed by the flexo printing becomes larger at the peripheral portion surrounding the center portion than at the center portion.

Therefore, in order to suppress the occurrence of the marginal phenomenon, the applicant of the present application has proposed a printing plate in which a distribution density of the projections 13 formed on the printing projection portion 12 is set higher in the peripheral edge region 12D than in a center region 12A of the printing projection portion 12, and has filed patent applications related to such printing plate (for example, see Patent Literatures 1 and 2). That is, in the peripheral edge region 12D of the printing projection portion 12, the distribution density of the projections 13 is set higher to have smaller gaps 14 of the projections 13, thereby reducing the amount of ink retained in the gaps 14. With such a configuration, the thickness of the printing film at the peripheral edge portion is prevented from becoming larger. According to the printing plates in Patent Literatures 1 and 2, the distribution density of the projections 13 in the peripheral edge region 12D of the printing projection portion 12 is set equal at printing direction portions 12B extending along a printing direction (rotation direction of the plate cylinder 51) and at perpendicular direction portions 12C extending along a perpendicular direction perpendicular to the printing direction (direction parallel to a rotary axis of the plate cylinder 51).

RELATED ART DOCUMENT

Patent Document

PTL 1: JP-B2-3376908
PTL 2: JP-A-2002-293049

SUMMARY OF INVENTION

However, although the occurrence of the marginal phenomenon is suppressed by the printing plates in Patent Literatures 1 and 2, there is a case in which the thickness of the printing film at the peripheral edge portion becomes larger. Therefore, there is room for improvement in view of such point.

The present disclosure has been made in view of such circumstances, and provides a printing plate capable of stably suppressing occurrence of the marginal phenomenon.

According to one embodiment of the present disclosure, there is provided a printing plate, including a printing projection portion having a plurality of projections formed in a distributed manner on a top surface of the printing projection portion, wherein the top surface of the printing projection portion includes a center region and a peripheral edge region adjacent to a peripheral edge of the center region, wherein the peripheral edge region includes printing direction portions extending along a printing direction and perpendicular direction portions extending along a perpendicular direction perpendicular to the printing direction, wherein distribution densities of the projections are different among the center region, the printing direction portions, and the perpendicular direction portions, and wherein, among the distribution densities, a distribution density in the perpendicular direction portions is set to be highest, and a distribution density in the printing direction portions is set to be lowest.

In order to stably suppress occurrence of the marginal phenomenon, the inventor has focused on a distribution density of a plurality of projections formed in a distributed manner on a top surface of a printing projection portion of a printing plate, and has conducted extensive studies. As a result, the inventor has found that the occurrence of the marginal phenomenon can be stably suppressed by the following method. That is, the distribution density of the projections is set to be different among the center region, the printing direction portions, and the perpendicular direction portions of the printing projection portion. Among those distribution densities, the distribution density in the perpendicular direction portions is set to be highest, and the distribution density in the printing direction portions is set to be lowest.

That is, it is assumed that, when the distribution density in the perpendicular direction portions is set to be highest and the distribution density in the printing direction portions is set to be lowest among the distribution densities of the projections as described above, the pressure generated at the time of contact of the printing projection portion with the anilox roll of the printing machine and the printing material causes the ink retained on the printing projection portion to be likely to spread with an even thickness on the top surface of the printing projection portion.

In the printing plate according to the present disclosure, the distribution densities of the projections are different among the center region of the printing projection portion and the printing direction portions and the perpendicular direction portions in the peripheral edge region. Among those distribution densities, the distribution density in the perpendicular direction portions is set to be highest, and the distribution density in the printing direction portions is set to be lowest. Therefore, the pressure generated at the time of contact of the printing projection portion with the anilox roll of the printing machine and the printing material causes the ink retained on the printing projection portion to be likely to spread with an even thickness on the top surface of the printing projection portion. As a result, the occurrence of the marginal phenomenon is stably suppressed, thereby being capable of further improving the evenness in thickness of the printing film.

In particular, when a ratio ($M_C/M_A$) between a distribution density ($M_C$) of the projections in the perpendicular direction portions and a distribution density ($M_A$) of the projections in the center region is set to 1.25, the improvement of the evenness in thickness of the printing film is conspicuous.

Further, when a ratio ($M_B/M_A$) between a distribution density ($M_B$) of the projections in the printing direction portions and the distribution density ($M_A$) of the projections in the center region is set to 0.75, the improvement of the evenness in thickness of the printing film is also conspicuous.

Moreover, when a ratio ($N_C/N_A$) between an occupancy area ratio ($N_C$) of the projections in the perpendicular direction portions and an occupancy area ratio ($N_A$) of the projections in the center region is set to 0.8, the distribution density of the projections can be set more suitable, thereby further improving the evenness in thickness of the printing film.

Further, when a ratio ($N_B/N_A$) between an occupancy area ratio ($N_B$) of the projections in the printing direction portions and the occupancy area ratio ($N_A$) of the projections in the center region is set to 0.95, the distribution density of the projections can also be set more suitable, thereby further improving the evenness in thickness of the printing film.

BRIEF DESCRIPTION OF DRAWINGS

FIGS. 1A to 1C are schematic illustrations of a printing plate according to one embodiment of the present disclosure, in which: FIG. 1A is a plan view of the printing plate; FIG. 1B is an enlarged sectional view for illustrating main portions taken along the line R-R of FIG. 1A; and FIG. 1C is an enlarged sectional view for illustrating main portions taken along the line S-S of FIG. 1A.

FIGS. 4A to 4C are schematic illustrations of a related-art printing plate, in which: FIG. 4A is a plan view of the printing plate; FIG. 4B is a sectional view taken along the line T-T of FIG. 4A; and FIG. 4C is an enlarged sectional view for illustrating main portions of FIG. 4B.

DESCRIPTION OF EMBODIMENTS

Next, detailed description is made of an embodiment of the present disclosure with reference to the drawings.

Figure 1:
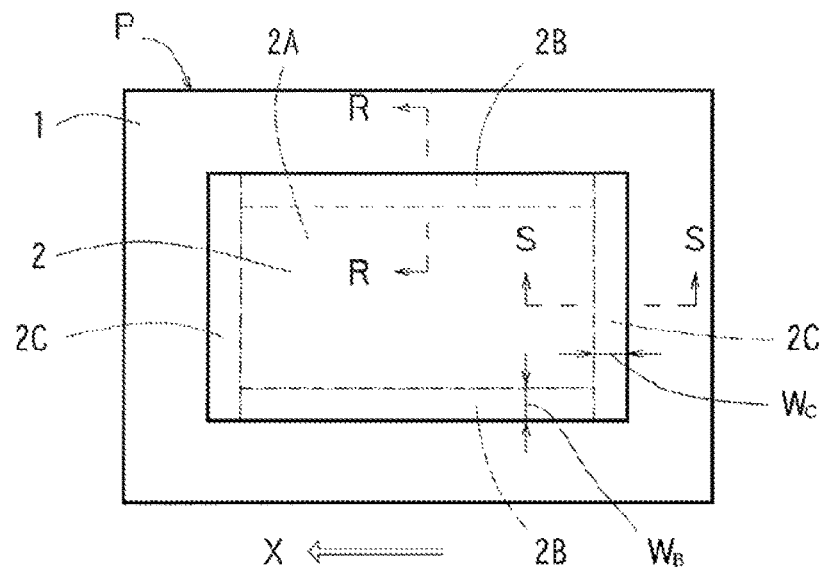
Figure 1:
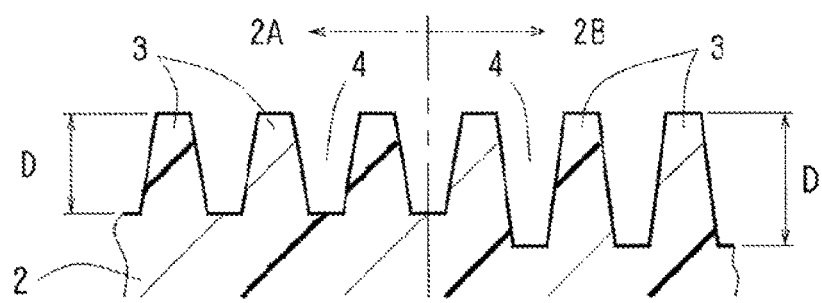
Figure 1:
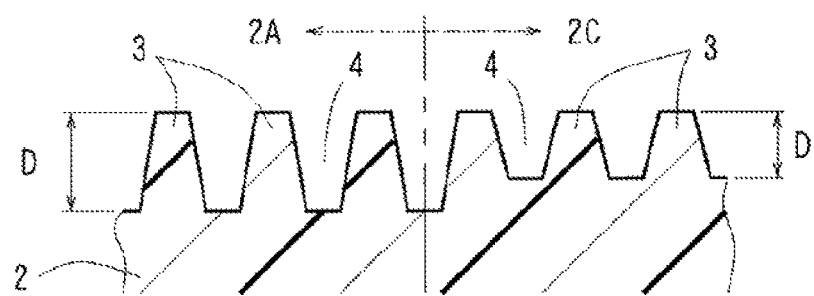
Figure 2:
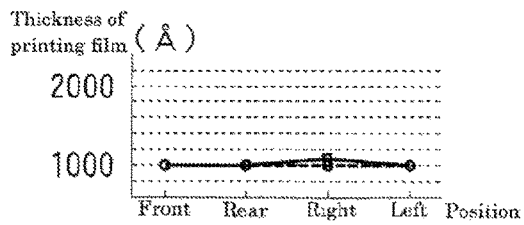
FIG. 2A to FIG. 2F are graphs for showing thicknesses of printing films in Example, Related-art Example, and Comparative Examples 1 to 4.
Figure 2:
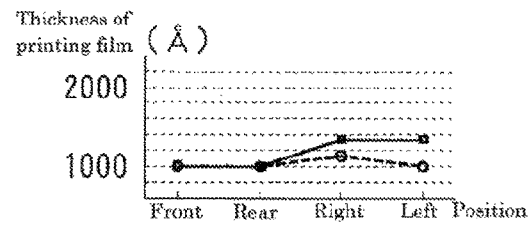
Figure 2:
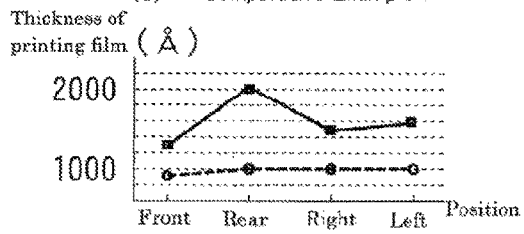
Figure 2:
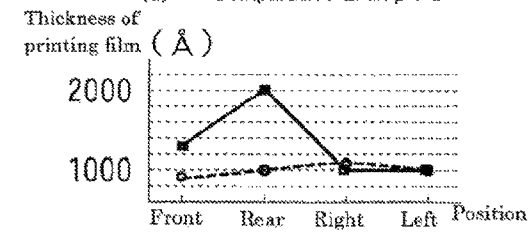
Figure 2:
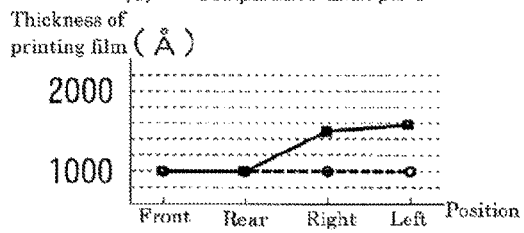
Figure 2:
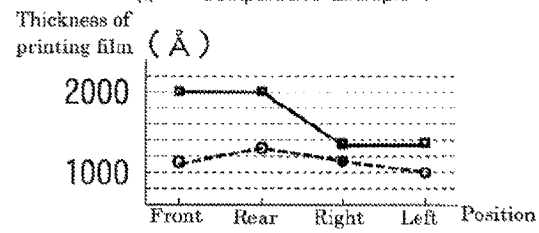

FIG. 1A is a plan view for illustrating a printing plate according to one embodiment of the present disclosure. FIG. 1B is an enlarged sectional view for illustrating main portions taken along the line R-R of FIG. 1A. FIG. 1C is an enlarged sectional view for illustrating main portions taken along the line S-S of FIG. 1A. A printing plate P of this embodiment includes a base portion 1 and a printing projection portion 2. The base portion 1 has a rectangular flat plate shape in plan view. The printing projection portion 2 has a rectangular shape in plan view, and is formed at a center portion of a surface of the base portion 1. A plurality of small projections 3 each having a truncated cone shape with gaps 4 are formed in a distributed manner on a top surface of the printing projection portion 2. The base portion 1, the printing projection portion 2, and the projections 3 are formed integrally with one another. In this embodiment, a direction of the arrow X extending along a long side of the printing projection portion 2 having the rectangular shape in plan view is set as a printing direction.

Moreover, the printing projection portion 2 is divided into three regions (portions) 2A to 2C based on a distribution density of the projections 3. The three regions (portions) 2A to 2C include a center region 2A, printing direction portions 2B, and perpendicular direction portions 2C of the printing projection portion 2. In a peripheral edge region adjacent to a peripheral edge of the center region 2A, the printing direction portions 2B extend along the printing direction, and the perpendicular direction portions 2C extend along a perpendicular direction perpendicular to the printing direction. Four corner portions of the printing projection portion 2 at which the printing direction portions 2B and the perpendicular direction portions 2C overlap are included in the perpendicular direction portions 2C.

In this embodiment, a distribution density in the perpendicular direction portions 2C is highest. A distribution density in the center region 2A is next highest. A distribution density in the printing direction portions 2B is lowest. When the distribution density of the projections 3 is indicated by, for example, the number of projections 3 per inch (25.4 mm), the distribution density in the perpendicular direction portions 2C having the highest distribution density is set within a range of from 400 projections per inch to 600 projections per inch. The distribution density in the center region 2A having the next highest distribution density is set within a range of from 300 projections per inch to 500 projections per inch. The distribution density in the printing direction portions 2B having the lowest distribution density is set within a range of from 200 projections per inch to 400 projections per inch. It is preferred that a ratio ($M_C/M_A$) between a distribution density ($M_C$) of the projections 3 in the perpendicular direction portions 2C and a distribution density ($M_A$) of the projections 3 in the center region 2A be set to 1.25. Further, it is preferred that a ratio ($M_B/M_A$) between a distribution density ($M_B$) of the projections 3 in the printing direction portions 2B and the density distribution density ($M_A$) of the projections 3 in the center region 2A be set to 0.75.

Further, in this embodiment, occupancy area ratios of the projections 3 are also different among the three regions (portions) 2A to 2C. The occupancy area ratios are set in the following descending order. The occupancy area ratio in the center region 2A is highest. The occupancy area ratio in the printing direction portions 2B is next highest. The occupancy area ratio in the perpendicular direction portions 2C is lowest. The occupancy area ratio of the projections 3 corresponds to a ratio between an area of the top surface of the printing projection portion 2 and a total bottom area of the projections 3. The occupancy area ratios of the projections 3 are set within the following ranges. That is, for example, the occupancy area ratio in the center region 2A having the highest occupancy area ratio is set within a range of from 40% to 50%. The occupancy area ratio in the printing direction portions 2B having the next highest occupancy area ratio is set within a range of from 38% to 48%. The occupancy area ratio in the perpendicular direction portions 2C having the lowest occupancy area ratio is set within a range of from 31% to 41%. It is preferred that a ratio ($N_C/N_A$) between an occupancy area ratio ($N_C$) of the projections 3 in the perpendicular direction portions 2C and an occupancy area ratio ($N_A$) of the projections 3 in the center region 2A be set to 0.8. Further, it is preferred that a ratio ($N_B/N_A$) between an occupancy area ratio ($N_B$) of the projections 3 in the printing direction portions 2B and the occupancy ratio ($N_A$) of the projections 3 in the center region 2A be set to 0.95.

Moreover, in this embodiment, depths (depth from the top surface of the projection 3 to the top surface of the printing projection portion 2) of the projections 3 are also different among the three regions (portions) 2A to 2C. The depths are set in the descending order reverse to the descending order of the distribution densities. That is, the depth 2 in the printing direction portions 2B is largest. The depth D1 in the center region 2A is next largest. The depth D in the perpendicular direction portions 2C is smallest. For example, the depth D2 of the projections 3 in the printing direction portions 2B having the largest depth is set within a range of from 15 μm to 25 μm. The depth D1 of the projections 3 in the center region 2A having the next largest depth is set within a range of from 10 μm to 20 μm. The depth D of the projections 3 in the perpendicular direction portions 2C having the smallest depth is set within a range of from 5 μm to 15 μm.

In each of the three regions (portions) 2A to 2C, the dimensions and formation pitches of the projections 3 are evenly set. Therefore, in each of the three regions (portions) 2A to 2C, the distribution density, the occupancy area ratio, and the depth of the projections 3 are also evenly set.

On the printing plate P, a region having the printing projection portion 2 is a print region. An outer shape dimension of the top surface of the printing projection portion 2 is set to an outer shape dimension of a printing film to be printed. A width WE of each of the printing direction portions 2B on the printing projection portion 2 is set within a range of from 1.2% to 2.2% of a perpendicular direction length (length of a side perpendicular to the printing direction) of the top surface of the printing projection portion 2. A width $W_C$ of each of the perpendicular direction portions 2C is set within a range of from 1.2% to 2.2% of a printing direction length (length of a side along the printing direction) of the top surface of the printing projection portion 2. Moreover, dimensions of the projections 3 each having the truncated cone shape are set as follows. For example, a diameter of a top surface is set within a range of from 20 μm to 70 μm. A diameter of a bottom surface is set within a range of from 185% to 300% of the diameter of the top surface. The depth is set within a range of from 5 μm to 25 μm. The formation pitch is set within a range of from 51 μm to 85 μm.

Figure 3:
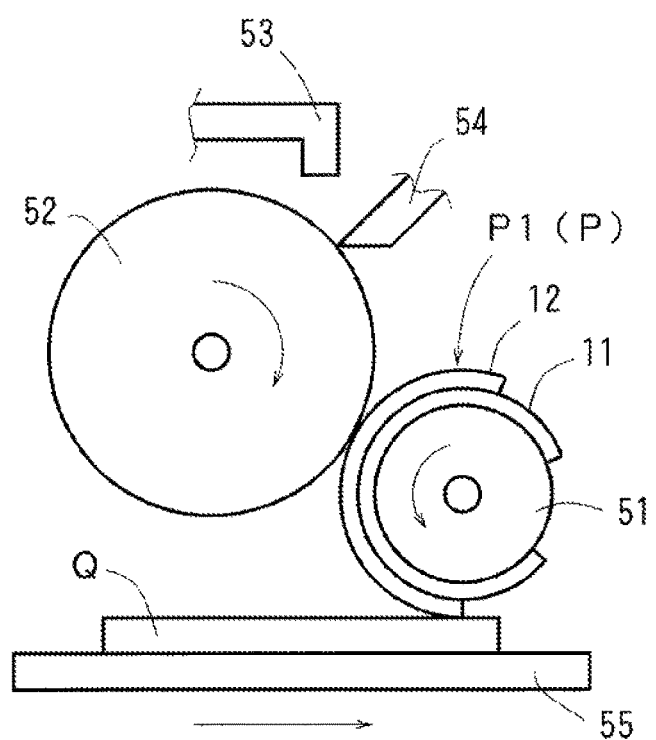
FIG. 3 is an explanatory view for schematically illustrating a printing machine using the printing plate.
Figure 4:
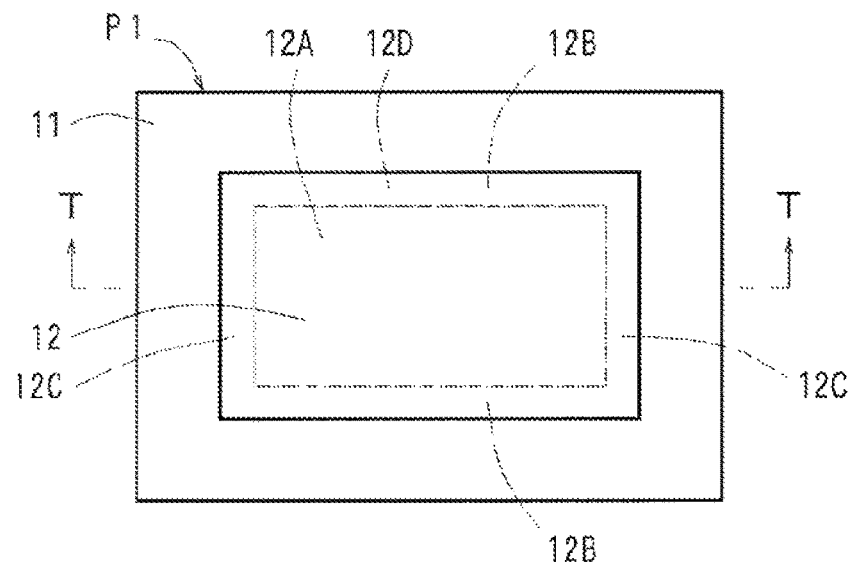
Figure 4:
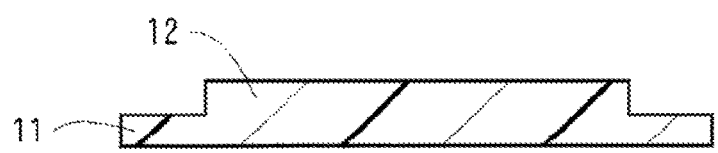
Figure 4:
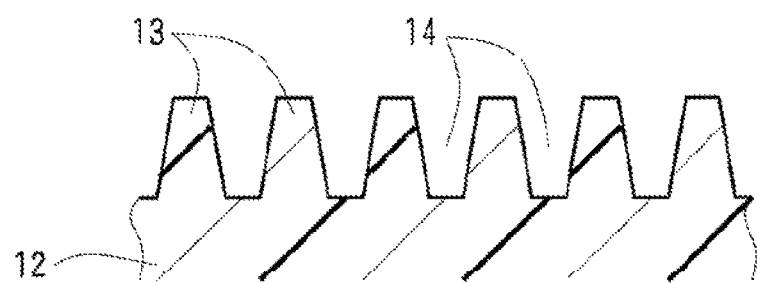

The printing plate P is to be used for the flexoprinting, and is flexible so that the printing plate P can be mounted to the peripheral surface of the plate cylinder 51 of the printing machine (see FIG. 3). A forming material to be used for the printing plate P may be, for example, resin or rubber. A forming method for the printing plate P may be, for example, molding. In particular, when a photosensitive resin is to be used as the forming material, the printing plate P may be formed by a photolithography method.

The flexo printing using the above-mentioned printing plate P enables formation of a printing film such as an alignment film of a liquid crystal display, an organic light-emitting film of an organic EL, or an electrode film of an electronic device with improved evenness in thickness.

At the time of the above-mentioned printing, through setting of the distribution density of the projections 3 on the printing plate P, the pressure generated at the time of contact of the printing projection portion 2 with the anilox roll 52 of the printing machine and the printing material Q (see FIG. 3) causes the ink retained on the printing projection portion 2 to be more likely to spread with an even thickness on the top surface of the printing projection portion 2. As a result, occurrence of the marginal phenomenon is stably suppressed, thereby being capable of improving the evenness in thickness of the printing film.

In the embodiment described above, the occupancy area ratios of the projections 3 are set in the following descending order. The occupancy area ratio in the center region 2A is highest. The occupancy area ratio in the printing direction portions 2B is next highest. The occupancy area ratio in the perpendicular direction portions 2C is lowest. However, as long as the distribution density of the projections 3 is set to be highest at the perpendicular direction portions 2C, other descending orders of the occupancy area ratios of the projections 3 may be employed. Even in such a case, the evenness in thickness of the printing film can be improved.

In the embodiment described above, the depths of the projections 3 are set in the following descending order. The depth D2 in the printing direction portions 2B is largest. The depth D1 in the center region 2A is next largest. The depth D3 in the perpendicular direction portions 2C is smallest. However, as long as the distribution density of the projections 3 is set to be highest at the perpendicular direction portions 2C, other descending orders of the depths of the projections 3 may be employed. Even in such a case, the evenness in thickness of the printing film can be improved.

In the embodiment described above, the projections 3 each have a truncated cone shape. However, other shape such as a columnar shape may be employed.

Next, an Example is described together with a Related-art Example and Comparative Examples. However, the present disclosure is not limited to the Example.

EXAMPLES

Example

A printing plate illustrated in FIG. 1A to FIG. 1C was prepared. This printing plate was made of a polybutadiene-based liquid photosetting resin as a forming material, and was formed by the photolithography method. The dimensions of the printing projection portion in plan view were set as follows. The center region had the dimension of 22.9 mm×22.9 mm. Each of the printing direction portions and the perpendicular direction portions in the peripheral edge region had a width of 0.2 mm. The distribution density of the projections was indicated by the number of projections per inch (25.4 mm). The center region had a distribution density of 400 (projections per inch). The printing direction portions had a distribution density of 300 (projections per inch). The perpendicular direction portions had a distribution density of 500 (projections per inch). The occupancy area ratios and depths of the projections are shown in Table 1 below.

In this Example, a ratio ($M_C/M_A$) between a distribution density ($M_C$) of the projections in the perpendicular direction portions and a distribution density ($M_A$) of the projections in the center region was set to 1.25. A ratio ($M_B/M_A$) between a distribution density ($M_B$) of the projections in the printing direction portions and the distribution density ($M_A$) of the projections in the center region was set to 0.75. Further, a ratio ($N_C/N_A$) between an occupancy area ratio ($N_C$) of the projections in the perpendicular direction portions and an occupancy area ratio ($N_A$) of the projections in the center region was set to 0.8. A ratio ($N_B/N_A$) between an occupancy area ratio ($N_B$) of the projections in the printing direction portions and the occupancy area ratio ($N_A$) of the projections in the center region was set to 0.95.

Related-Art Example

The Example described above was modified such that the distribution density of the projections in the peripheral edge region was set to 500 (projections per inch) at each of the printing direction portions and the perpendicular direction portions.

Comparative Example 1

The Example described above was modified such that the distribution density of the projections in the peripheral edge region was set to 400 (projections per inch) which was equal to the distribution density in the center region.

Comparative Example 2

The Example described above was modified such that the distribution density of the projections in the perpendicular direction portions in the peripheral edge region was set to 400 (projections per inch) which was equal to the distribution density in the center region.

Comparative Example 3

The Example described above was modified such that the distribution density of the projections in the printing direction portions in the peripheral edge region was set to 400 (projections per inch) which was equal to the distribution density in the center region.

Comparative Example 4

The Example described above was modified such that the distribution density of the projections in the perpendicular direction portions in the peripheral edge region and the distribution density of the projections at the printing direction portions were replaced with one another. That is, the distribution density of the projections in the printing direction portions was set to 500 (projections per inch), and the distribution density of the projections in the perpendicular direction portions was set to 300 (projections per inch).

|  |  | Example | Related-art Example | Comparative Examples | | | |
|---|---|---|---|---|---|---|---|
|  |  |  |  | 1 | 2 | 3 | 4 |
| Distribution density | Center region |  |  | 400 |  |  |  |
|  | Perpendicular direction portion | 500 |  | 400 |  | 500 | 300 |
|  | Printing direction portion | 300 | 500 | 400 | 300 | 400 | 500 |
| Occupancy area ratio | Center region |  |  | 45 |  |  |  |
|  | Perpendicular direction portion | 36 |  | 45 |  | 36 | 43 |
|  | Printing direction portion | 43 | 36 | 45 | 43 | 45 | 36 |
| Depth | Center region |  |  | 14.1 |  |  |  |
|  | Perpendicular direction portion | 11.6 |  | 14.1 |  | 11.6 | 20.7 |
|  | Printing direction portion | 20.7 | 11.6 | 14.1 | 20.7 | 14.1 | 11.6 |

Units: distribution density (projections per inch), occupancy area ratio (%), depth (μm)

Printing

The printing plates of the Example, Related-art Example, and Comparative Examples 1 to 4 described above were mounted to the plate cylinder of the printing machine illustrated in FIG. 3. Printing was performed with use of a liquid crystal alignment agent as the ink and a glass board as the printing material, thereby forming a pattern of a liquid crystal alignment film as the printing film on the glass board.
[Measurement of Thickness of Printing Film]
A thickness of the printing film was measured with use of a film thickness measurement device (ET-1479 manufactured by Kosaka Laboratory Ltd.). Measurement was performed on four positions including the front, rear, left, and right in the printing direction for each of the regions of the printing film printed in the center region and the peripheral edge region of the printing projection portion. The results are shown in FIG. 2A to FIG. 2F.

From the results shown in FIG. 2A to FIG. 2F, it can be understood that the evenness in thickness of the printing film is excellent in the Example. It can be understood that the Related-art Example also exhibits excellent evenness in thickness of the printing film but is slightly inferior to the Example described above. Moreover, it can be understood that the evenness in thickness of the printing films of the Comparative Examples 1 to 4 is inferior to that of the Example.

A specific embodiment of the present disclosure has been described in Example above. However, the Example is for illustrative purposes only and is not to be construed as limitative. It is intended that various modifications apparent to a person skilled in the art fall within the scope of the present disclosure.

The printing plate according to the present disclosure is usable for a case of stably suppressing occurrence of the marginal phenomenon and improving evenness in thickness of the printing film.

REFERENCE SIGNS LIST

P printing plate
2 printing projection portion
2A center region
2B printing direction portion
2C perpendicular direction portion
3 projection

The invention claimed is:
1. A printing plate, comprising:
a printing projection portion having a plurality of projections formed in a distributed manner on a top surface of the printing projection portion,
wherein the top surface of the printing projection portion includes a center region and a peripheral edge region adjacent to a peripheral edge of the center region,
wherein the peripheral edge region includes printing direction portions extending along a printing direction and perpendicular direction portions extending along a perpendicular direction perpendicular to the printing direction,
wherein distribution densities of the projections are different among the center region, the printing direction portions, and the perpendicular direction portions, and
wherein, among the distribution densities of the projections, a distribution density in the perpendicular direction portions is highest, and a distribution density in the printing direction portions is lowest.

2. The printing plate according to claim 1, wherein a ratio (MC/MA) between a distribution density (MC) of the projections in the perpendicular direction portions and a distribution density (MA) of the projections in the center region is 1.25.

3. The printing plate according to claim 1, wherein a ratio (MB/MA) between a distribution density (MB) of the projections in the printing direction portions and the distribution density (MA) of the projections in the center region is 0.75.

4. The printing plate according to claim 1, wherein a ratio (NC/NA) between an occupancy area ratio (NC) of the projections in the perpendicular direction portions and an occupancy area ratio (NA) of the projections in the center region is 0.8.

5. The printing plate according to claim 1, wherein a ratio (NB/NA) between an occupancy area ratio (NB) of the projections in the printing direction portions and the occupancy area ratio (NA) of the projections in the center region is 0.95.

* * * * *